US012693324B2

(12) United States Patent
Giesen

(10) Patent No.: US 12,693,324 B2
(45) Date of Patent: Jul. 28, 2026

(54) DYNAMIC TDR WINDOW ADJUSTMENT USING A LIQUID-CONTROLLED DELAY

(71) Applicant: International Business Machines Corporation, Armonk, NY (US)

(72) Inventor: Kyle Indukummar Giesen, Pittsboro, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 371 days.

(21) Appl. No.: 18/510,952

(22) Filed: Nov. 16, 2023

(65) Prior Publication Data

US 2025/0164538 A1 May 22, 2025

(51) Int. Cl.
| | |
|---|---|
| *G01R 31/11* | (2006.01) |
| *H10D 30/01* | (2025.01) |
| *H10D 30/43* | (2025.01) |
| *H10D 30/67* | (2025.01) |
| *H10D 62/10* | (2025.01) |

(52) U.S. Cl.
CPC ........... *G01R 31/11* (2013.01); *H10D 30/014* (2025.01); *H10D 30/43* (2025.01); *H10D 30/6735* (2025.01); *H10D 30/6757* (2025.01); *H10D 62/115* (2025.01)

(58) Field of Classification Search
CPC ...... G01R 31/11; H10D 30/014; H10D 30/43; H10D 30/6735; H10D 30/6757; H10D 62/115
USPC .......................................................... 324/533
See application file for complete search history.

(56) References Cited

U.S. PATENT DOCUMENTS

| | | | |
|---|---|---|---|
| 6,998,834 B2 | 2/2006 | Agoston et al. | |
| 7,844,408 B2 | 11/2010 | Chen et al. | |
| 7,893,695 B2 | 2/2011 | Roth | |
| 10,185,020 B1* | 1/2019 | Okuyama | H04B 3/46 |
| 10,673,732 B2 | 6/2020 | Alves et al. | |
| 10,732,222 B2 | 8/2020 | Peschke et al. | |
| 10,908,206 B2 | 2/2021 | Xie et al. | |
| 2011/0304340 A1* | 12/2011 | Hall | G01R 31/11 |
| | | | 324/533 |
| 2012/0197583 A1* | 8/2012 | Liang | G01R 31/2801 |
| | | | 702/125 |
| 2016/0003662 A1* | 1/2016 | Dayal | G01R 27/26 |
| | | | 73/304 R |
| 2016/0191118 A1 | 6/2016 | Kalavai | |
| 2016/0337512 A1* | 11/2016 | Kalavai | H04M 3/30 |
| 2017/0023632 A1* | 1/2017 | Johnson | G01R 31/11 |

(Continued)

FOREIGN PATENT DOCUMENTS

| | | |
|---|---|---|
| CN | 105675990 A | 6/2016 |
| CN | 108152709 A | 6/2018 |

*Primary Examiner* — Raul J Rios Russo
(74) *Attorney, Agent, or Firm* — Stosch Sabo, Esq.; Kevin P. Radigan, Esq.; Heslin Rothenberg Farley & Mesiti P.C.

(57) ABSTRACT

The embodiments herein describe using a liquid-controlled delay to adjust a window used by a TDR. The liquid-controlled delay can be disposed between the TDR and the device under test (DUT) (e.g., cables, PCB, etc.). Controlling the temperature of the liquid in the liquid-controlled delay controls the amount of delay it provides to the TDR signal, which moves the window of the TDR forward or backward relative to time. This permits the TDR to capture finer detailed information at specific points or regions of interest in the DUT.

14 Claims, 5 Drawing Sheets

(56)     References Cited

U.S. PATENT DOCUMENTS

| | | | |
|---|---|---|---|
| 2017/0242419 A1* | 8/2017 | Duncan .................. | G01R 31/50 |
| 2023/0273659 A1* | 8/2023 | Guim Bernat ............ | G06F 1/20 |
| | | | 361/679.46 |

* cited by examiner

201

TDR 205

215 DUT

210 Liquid-controlled Delay

400

405

Perform a first TDR scan to identify points of interest

410

Configure the TDR to move a window at a first point of interest

415

Adjust the temperature of the liquid-controlled delay to shift the window to a second point of interest

DYNAMIC TDR WINDOW ADJUSTMENT USING A LIQUID-CONTROLLED DELAY

BACKGROUND

The present invention relates to using a liquid-controlled delay with a time-domain reflectometer (TDR).

A TDR is an electronic instrument used to determine the characteristics of electrical lines by observing reflected pulses. It can be used to characterize and locate faults in cables (for example, twisted pair wire or coaxial cable), and to locate discontinuities in a connector, printed circuit board (PCB), or any other electrical path.

A TDR measures reflections along a conductor. To measure those reflections, the TDR transmits an incident signal onto the conductor and measures its reflections. If the conductor is of a uniform impedance and is properly terminated, then there will be no reflections and the remaining incident signal will be absorbed at the far-end by the termination. Instead, if there are impedance variations, then some of the incident signal is reflected back to the source.

To improve accuracy, a window can be used to focus on a specific point or region of the conductor being tested. However, it can take several hours to configure a testing system to generate a window for testing a specific point of interest, which depends on time of flight (ToF), the shape of the conductor, path of the conductor, and the material of the conductor. If there are several points of interests to be inspected, the configuration time scales linearly which makes using the windowing technique undesirable in many cases.

SUMMARY

According to one embodiment of the present invention, a liquid-controlled delay includes a transmission line configured to couple at a first end to a TDR and at a second end to a device under test (DUT), a liquid, wherein the transmission line is submerged in the liquid, and a heater configured to control a temperature of the liquid to affect a delay of a signal of the TDR propagating through the transmission line.

According to one embodiment of the present invention, a system includes a TDR, a DUT, a liquid-controlled delay coupled between the TDR and the DUT, and a controller configured to control a temperature of liquid in the liquid-controlled delay to shift a window of the TDR to multiple points of interest along a signal path of the DUT.

According to one embodiment of the present invention, a method includes performing a first scan using a TDR to identify a plurality of points of interest along a signal path of a DUT where the TDR is coupled to the DUT through a liquid-controlled delay, configure the TDR to place a window at a first point of interest of the plurality of points of interest, and adjusting a temperature of the liquid-controlled delay to shift the window from the first point of interest to a second point of interest of the plurality of points of interest.

DETAILED DESCRIPTION

Figure 1:
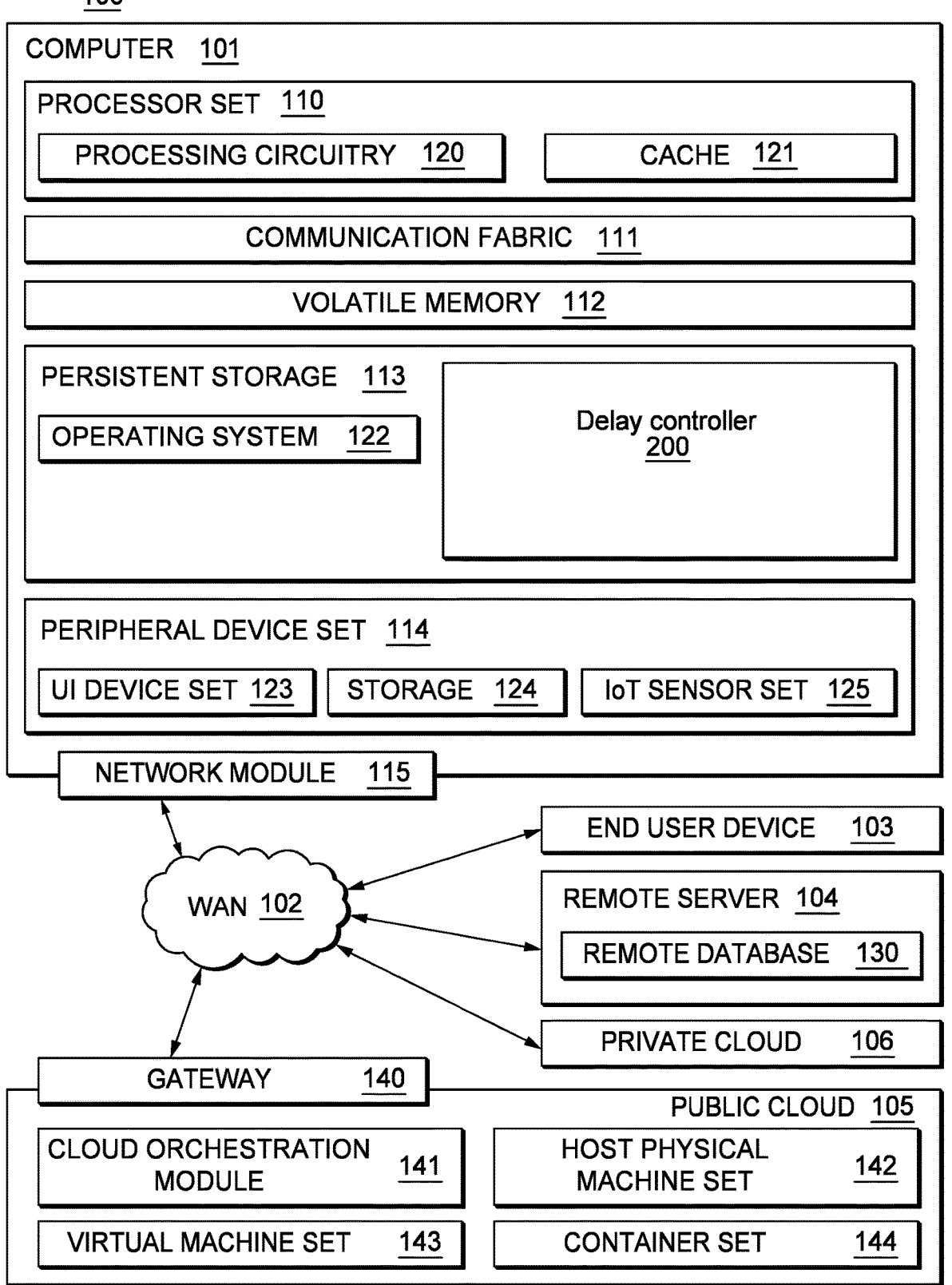
FIG. 1 illustrates a computing environment, according to one embodiment.

The embodiments herein describe using a liquid-controlled delay to adjust a window used by a TDR. The liquid-controlled delay can be disposed between the TDR and the device under test (DUT) (e.g., cables, PCB, etc.). Controlling the temperature of the liquid (e.g., a cooling fluid) in the liquid-controlled delay controls the amount of delay which moves the window of the TDR forward or backward relative to time. Instead of taking hours, it can take less than a minute to adjust the delay to move the TDR window from a first point of interest to a second point of interest. This makes testing several points of interest in a DUT a quick task by using the liquid-controlled delay to slide a TDR window.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as a delay controller 200 to move a window associated with a TDR scan. In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2:
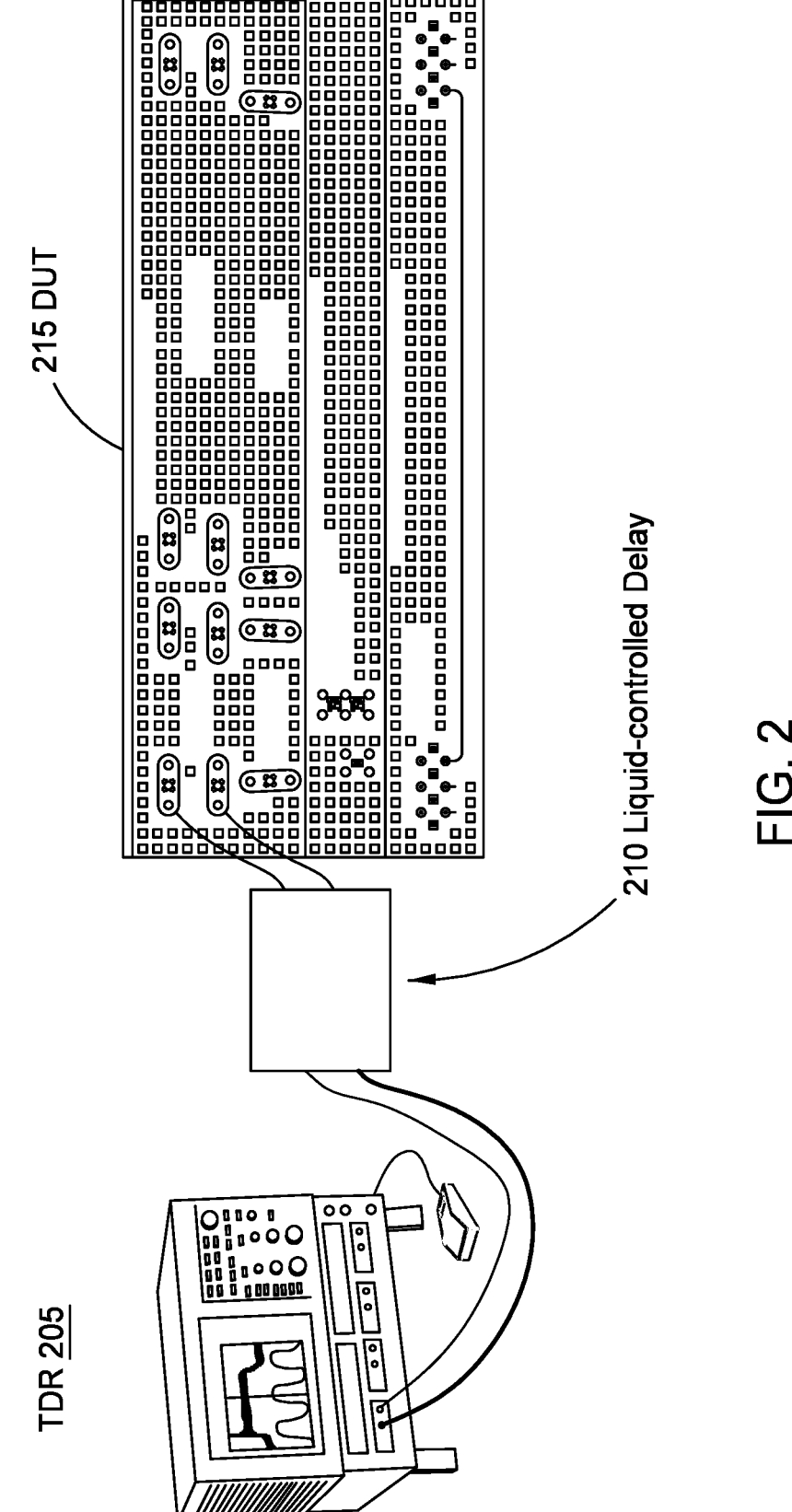
FIG. 2 illustrates a testing system with a liquid-controlled delay, according to one embodiment.

FIG. 2 illustrates a testing system 201 with a liquid-controlled delay 210, according to one embodiment. As shown, the system 201 includes a TDR 205 that is coupled to a DUT 215 through the liquid-controlled delay 210. The details of the liquid-controlled delay 210 are discussed in more detail below, but in general, the delay 210 includes a liquid where the temperature of the liquid affects a delay of the signal generated by the TDR 205. This can be used to move a window of the TDR to focus on different locations (or points of interest) in the DUT 215.

In one embodiment, the TDR 205 generates a step or impulse of energy (referred to as the TDR signal). The TDR 205 then measures the energy reflected by the DUT 215. By analyzing the magnitude, duration, and shape of the reflected waveform, the TDR 205 (or a software application) determines a profile of the impedance variation in the DUT 215.

The reflections often have the same shape as the incident signal, but their sign and magnitude depend on the change in impedance level. For example, a step increase in the impedance results in a reflection that has the same sign as the incident signal. Conversely, a step decrease in impedance results in a reflection that has the opposite sign. The magnitude of the reflection depends on the amount of the impedance change as well as the loss in the conductor.

The reflections are measured at the output/input to the TDR 205 and can be displayed or plotted as a function of time. Alternatively, the display can be read as a function of cable length because the speed of signal propagation is almost constant for a given transmission medium.

In most TDR applications, the use of a calibration method known as "windowing" allows the user to narrow down the test region to a specific area or point in the DUT 215. Windowing removes significant sources of error created as a byproduct of global TDR testing which tests the entire length of a signal path in the DUT 215. Windowing is typically done by performing multiple exploratory tests to find the bounds of the desired region using direct measurement. If the material characteristics and geometries of the DUT are known, this can be done via ToF calculations or complex simulation. Both methods are time consuming, and the latter is also computationally intensive. This process is repeated for each area of a DUT that is under investigation, and for that reason using TDR to test or explore complex structures with multiple areas of interest becomes a major undertaking in terms of time and resources. This often leads to destructive but faster tests being done on the DUT instead of the non-invasive TDR tests.

However, adding the liquid-controlled delay 210 greatly reduces the time required to perform windowing for multiple regions or points of interest in the DUT 215. After finding a small granular region of the DUT (preferable a central location of the signal path), heating the fluid in the delay 210 or inversely allowing it to cool, changes the material characteristics of the delay 210 due to the variable permittivity of the cooling fluid as a function of temperature. This in turn moves the location of the windowed region of the DUT 215 further or closer along the signal path. This can be used in failure analysis to find subtle variables in the DUT 215 or to find localized material characteristics in order to refine simulation input. It allows for the detailed testing of multiple components using the same calibration which drastically reduces the time needed to test complex structures. If an element is discovered that requires more exploration, its physical location can quickly be found by comparing the temperature and subsequent permittivity of the cooling fluid to room temperature permittivity to find the delta which can then be used to modify the original ToF calculation.

In FIG. 2, the DUT 215 is a PCB that can include any number of transmission lines (e.g., traces) that form a signal path that transmits the signal generated by the TDR 205. However, the DUT 215 can be any conductive material that forms a signal path, such as cables, a wire bond in an integrated circuit (IC) package, a deposited trace, and the like.

Figure 3:
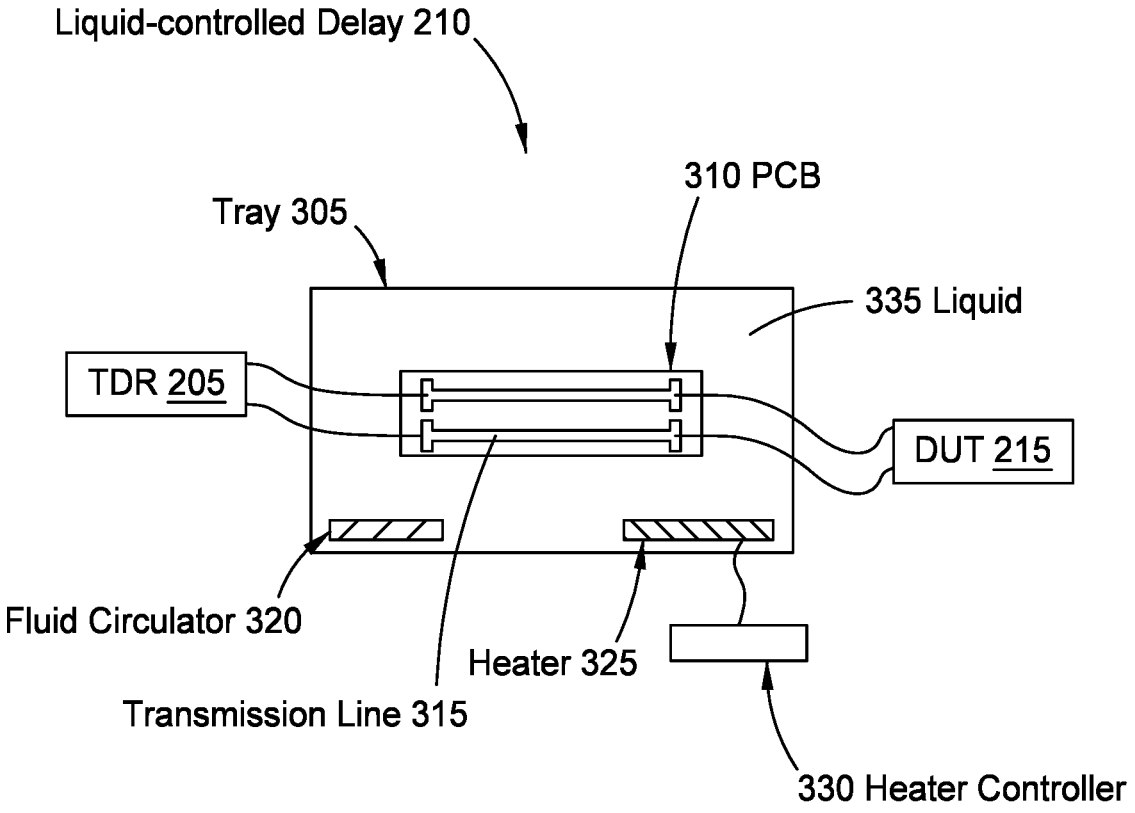
FIG. 3 illustrates a liquid-controlled delay, according to one embodiment.

FIG. 3 illustrates one example of the liquid-controlled delay 210, according to one embodiment. In this example, the liquid-controlled delay 210 includes a PCB 310 that is immersed (or submerged) in liquid 335 contained within a tray 305 (e.g., or any other suitable container). In one embodiment, the tray 305 may form a sealed container. For example, the sealed container may have plugs or connectors on its external surface where the TDR 205 and the DUT 215 can be electrically connected. These plugs or connecters can then be permanently connected to first ends and second ends of the transmission lines 315. That way, different TDRs 205 and DUTs 215 can be coupled to the delay 210. Moreover, by using a sealed container, the liquid-controlled delay 210 can be easily packaged and transported so the liquid 335 does not spill.

In one embodiment, the liquid 335 is a cooling fluid that may be used to cool electronic devices or mechanical devices. One advantage of using a specialized cooling fluid is that it is compatible with the PCB 310. That is, cooling fluids used for electronic devices (e.g., computing devices) may not corrode the electronic devices. However, the embodiments herein are not limited to a particular type of liquid 335. For example, deionized water can be used as the liquid 335 although it may have the disadvantage of causing corrosion. In any case, any liquid 335 where its dielectric constant changes according to temperature can be used. Changing the temperature changes the permittivity of the liquid 335 which alters the amount of delay generated by the liquid-controlled delay 210.

As shown, transmission lines 315 (e.g., microstrips) in the PCB 310 are connected at respective first ends to the TDR so that the TDR signal travels through the transmission lines 315 before reaching the DUT 215, which is coupled to respective second ends of the transmission lines 315. The transmission lines 315 can be electrically coupled directly to the DUT 215 in the original design phase or a more generic interposer can then be used in conjunction with a set of connectors before connecting to the DUT 215.

In one embodiment, the transmission lines 315 are made using standard copper trace manufacturing with a plated corrosion inhibitor added to the trace surface. Standard nickel gold (NiAu) surface treatment can be used and requires no new technologies for the manufacturer of the PCB 310. In one embodiment, no solder mask is applied to the transmission lines 315.

In one embodiment, a dam is formed around the transmission lines 315 allowing for the immersion of the PCB 310 in an immersion cooling liquid 335. In one embodiment, this dam is inert and high enough to suspend heating probes for a heater 325. The heating probes are placed in the liquid 335 along with a temperature probe (not shown). The heater 325 can be controlled by a heater controller 330 to change the temperature of the liquid 335 which in turn changes the electrical characteristics of the transmission line 315. For example, controlling the temperature of the liquid 335 controls the temperature of the transmission lines 315 due to the variable permittivity of the cooling fluid as a function of temperature.

In one experiment, an average variation of 6 in the relative permittivity for the liquid 335 was achieved by varying the temperature from 10 degrees C. to 20 degrees C. While this is a large change, the impact of this is reduced to a manageable level due to the fact that only a portion of the electromagnetic (EM) fields around the transmission lines 315 may pass through the liquid 335. This variation in relative permittivity can be further reduced (if desired) by adding a solder mask to the transmission line 315 (e.g., adding a solder mask to a microstrip). Having a larger variation in the relative permittivity can result in larger delays and larger window shifts which may be desirable for some application, but having smaller variations in relative permittivity can be used for more fine-grain control of the window, which may be useful for other applications.

the change in relative permittivity of the liquid 335 shifts the location of the windowed region of the DUT 215 further or closer along the signal path because it changes the ToF of the TDR signal in the transmission line 315 submerged in the liquid 335. As discussed above, this can be used in failure analysis to find variables along a signal path in the DUT 215 or to find localized material characteristics in order to refine simulation input without recalibration. The delay 210 allows for the testing of multiple components using the same calibration which drastically reduces the time needed to test complex structures. If an element is discovered that requires more exploration, its physical location can easily be found by comparing the temperature and subsequent permittivity of the liquid 335 to room temperature permittivity to find the delta which can then be used to modify the original ToF calculation.

The liquid-controlled delay 210 also includes a fluid circulator 320 in the tray 305 which can circulate the liquid 335. This may ensure the liquid 335 has a consistent temperature throughout the tray 305. However, the fluid circulator 320 is optional.

The size of the PCB 310 and the transmission lines 315 can vary depending on the application. For example, wider transmission lines 315 may be used if greater delay variations are desired, while narrower transmission lines 315 can result in more fine-grained control of the delay. In one embodiment, the PCB 310 may have dimensions around 0.5 inches by 3 inches.

Figure 4:
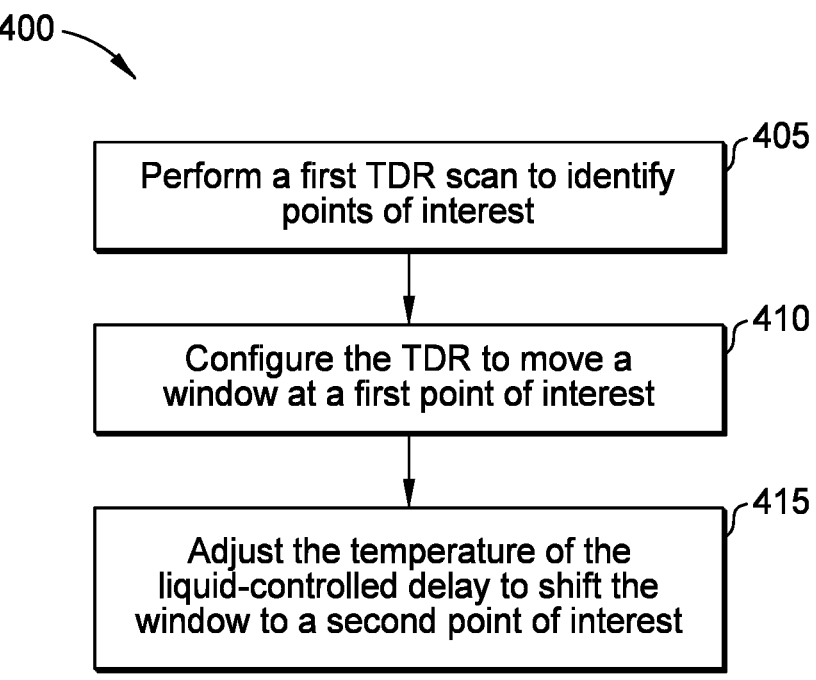
FIG. 4 is a flowchart of adjusting a window using a liquid-controlled delay, according to one embodiment.
Figure 5:
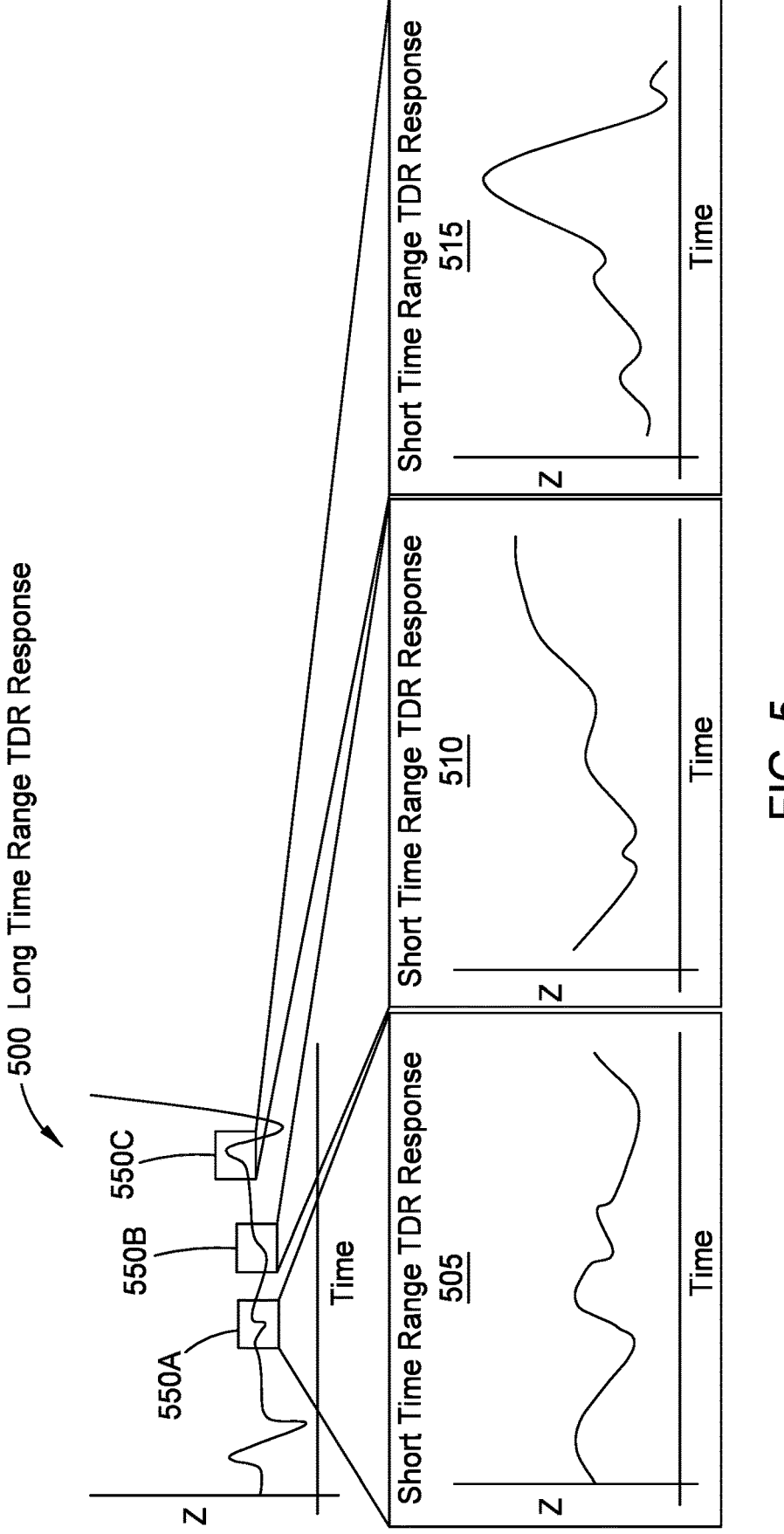
FIG. 5 illustrates different points of interest in a TDR scan, according to one embodiment.

FIG. 4 is a flowchart of a method 400 of adjusting a window using a liquid-controlled delay, according to one embodiment. At block 405, the TDR performs a first scan to identify points of interests (or regions of interests) in the DUT. In one embodiment, the first scan may be to scan the entire signal path in the DUT (e.g., the length of a trace, cable, microstrip, etc.). However, as discussed above, scanning the entire length may not provide very detailed information about a particular region in the signal path that may be a problem or faulty. This is shown in FIG. 5 which illustrates different points of interest in a TDR scan, according to one embodiment. FIG. 5 illustrates a long time range TDR response 500, which may be the first scan performed at block 405. This response 500 shows the impedance (Z) of the DUT with respect to time. In one embodiment, the response 500 may be displayed on a display screen that is part of the TDR. However, in other embodiments, the response 500 may be displayed by a computing system that is coupled to the TDR.

In FIG. 5, the TDR response 500 has three points (or regions) of interests 550A-C. However, in the plot of the response 500, there is not sufficient detail for a technician to determine whether there are faults at these three points.

Returning to the method 400, at block 410 the technician configures the TDR to move a window at a first point of interest. In one embodiment, the first window may be placed by determining (or estimating) the ToF required from the signal to propagate from the TDR to the first point of interest. For example, the software application can be used to model the DUT and the estimate the ToF from the TDR to a particular point of interest as indicated by the technician. If an accurate model of the DUT is not available, the technician may use trial and error to estimate the ToF to establish the window. Further, the TDR may be calibrated to determine a width of the window. For example, the window may not be sufficient wide (e.g., relative to time), to capture the reflections caused by a particular point or region of interest. The technician may widen (or shrink) the window by configuring the TDR to capture, in greater detail, the characteristics of a specific point or region of interest along the signal path of the DUT.

Referring again to FIG. 5, the technician can perform block 410 to move a window to obtain the short time range TDR response 505, which is displayed on a display screen of the TDR. That is, instead of showing the reflections of the entire signal path of the DUT, the short time range TDR response 505 shows the reflections only at the first point of interest 550A shown in the long time range TDR response 500.

At block 415, the technician adjusts the temperature of the liquid-controlled delay to shift the window to a second point of interest. For example, the technician can use the delay controller 200 in FIG. 1 which controls the heater controller 330 in FIG. 3 to heat the liquid 335. As discussed above, heating the liquid 335 changes its permittivity which in turn changes the electrical characteristics of the transmission line 315. That is, the temperature of the liquid 335 changes the delay of the TDR signal propagating through the transmission line 315.

Referring again to FIG. 5, the technician can use the delay controller and the heater controller to move the window from the first point of interest 550A in the DUT to the next (second) point of interest 550B to obtain the short time range TDR response 510. That is, the short time range TDR response 510 provides a more detailed view of the reflections of the signal path at the second point of interest 550B.

The technician can continue to change the temperature of the liquid until the window is moved to the third point of interest 550C. This point of interest corresponds to the short time range TDR response 515, which again, provides a more detailed view of the reflections of the signal path of the DUT at the third point of interest 550C. In this manner, a technician can shift a window to multiple points of interests along a signal path of a DUT using the liquid-controlled delay. This shifting can take only minutes, or only seconds. This permits the technician to view much more detailed TDR responses at specific locations rather than being limited to the "rough" data illustrated by the long time range TDR response 500.

The method 400 allows for quick and refined exploratory TDR testing or complex structures without the need for intensive simulation or computation. This method is especially valuable when detailed characteristics of the DUT are not known as is the case in many failure analysis situations or for first use exploratory testing. The methods described herein allow for the analysis of very granular regions of unknown DUTs to be understood in a quick and reliable way, but can be used if the characteristics of the DUTs are well known.

While the foregoing is directed to embodiments of the present invention, other and further embodiments of the invention may be devised without departing from the basic scope thereof, and the scope thereof is determined by the claims that follow.

What is claimed is:

1. A liquid-controlled delay comprising:
a transmission line configured to couple at a first end to a time-domain reflectometer (TDR) and at a second end to a device under test (DUT);
a liquid, wherein the transmission line is submerged in the liquid;
a heater configured to control a temperature of the liquid to affect a delay of a signal of the TDR propagating through the transmission line; and
a printed circuit board (PCB) comprising a pair of transmission lines, which includes the transmission line, wherein the pair of transmission lines are configured to couple at respective first ends to the TDR and at respective second ends to the DUT.

2. The liquid-controlled delay of claim 1, wherein the transmission line is a microstrip disposed on the PCB.

3. The liquid-controlled delay of claim 1, further comprising:
a fluid circulator configured to circulate the liquid within a container.

4. The liquid-controlled delay of claim 1, further comprising:
a sealed container that contains the transmission line, the liquid, and the heater.

5. The liquid-controlled delay of claim 1, wherein the liquid is a cooling fluid selected to cool electronic devices.

6. The liquid-controlled delay of claim 5, wherein the cooling fluid does not corrode electronic devices.

7. A system, comprising:
a time-domain reflectometer (TDR);
a device under test (DUT);
a liquid-controlled delay coupled between the TDR and the DUT; and
a controller configured to control a temperature of liquid in the liquid-controlled delay to shift a window of the TDR to multiple points of interest along a signal path of the DUT;
a heater configured to control the temperature of the liquid; and
a printed circuit board (PCB) comprising a pair of transmission lines configured to couple at a first end to the TDR and at a second end to the DUT, which includes the transmission line, wherein the pair of transmission lines are configured to couple at respective first ends to the TDR and at respective second ends to the DUT.

8. The system of claim 7, wherein the transmission line is a microstrip disposed on the PCB.

9. The system of claim 7, wherein the liquid-controlled delay comprises:
a fluid circulator configured to circulate the liquid within a container.

10. The system of claim 7, wherein the liquid-controlled delay comprises:
a sealed container that contains the transmission line, the liquid, and the heater.

11. The system of claim 7, wherein the liquid is a cooling fluid selected to cool electronic devices that does not corrode electronic devices.

12. A method comprising:
performing a first scan using a time-domain reflectometer (TDR) to identify a plurality of points of interest along a signal path of a device under test (DUT), wherein the TDR is coupled to the DUT by a pair of transmission lines that are submerged in a liquid in a liquid-controlled delay, wherein the pair of transmission lines are disposed on a printed circuit board (PCB);
configure the TDR to place a window at a first point of interest of the plurality of points of interest; and
adjusting a temperature of the liquid-controlled delay to shift the window from the first point of interest to a second point of interest of the plurality of points of interest.

13. The method of claim 12, further comprising:
adjusting the temperature of the liquid-controlled delay to shift the window from the second point of interest to a third point of interest of the plurality of points of interest.

14. The method of claim 12, wherein the liquid-controlled delay comprises:
a heater configured to control the temperature of the liquid to shift the window.

* * * * *